US008877558B2

(12) United States Patent
King et al.

(10) Patent No.: US 8,877,558 B2
(45) Date of Patent: Nov. 4, 2014

(54) METHOD FOR MAKING ELECTRONIC DEVICE WITH LIQUID CRYSTAL POLYMER AND RELATED DEVICES

(71) Applicant: Harris Corporation, Melbourne, FL (US)

(72) Inventors: Andrew Craig King, Melbourne, FL (US); Michael Raymond Weatherspoon, West Melbourne, FL (US); Louis J. Rendek, Jr., Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 37 days.

(21) Appl. No.: 13/761,833

(22) Filed: Feb. 7, 2013

(65) Prior Publication Data

US 2014/0217618 A1 Aug. 7, 2014

(51) Int. Cl.
*H01L 21/00* (2006.01)
*H01L 21/762* (2006.01)
*H01L 23/498* (2006.01)

(52) U.S. Cl.
CPC ........ *H01L 21/76251* (2013.01); *H01L 23/498* (2013.01)
USPC .... 438/118; 438/108; 438/617; 257/E21.503; 257/783

(58) Field of Classification Search
CPC ................. H01L 2924/01079; H01L 2924/14; H01L 2924/01078
USPC ................. 438/108, 118, 612, 614, 617, 666; 257/E21.503, E21.511, 778–786
See application file for complete search history.

(56) References Cited

U.S. PATENT DOCUMENTS

| 5,196,371 | A  | * | 3/1993 | Kulesza et al. | 438/119 |
| 5,394,490 | A  | * | 2/1995 | Kato et al. | 385/14 |
| 5,534,094 | A  |   | 7/1996 | Arjavalingam et al. | |
| 6,020,220 | A  | * | 2/2000 | Gilleo et al. | 438/119 |
| 6,183,588 | B1 |   | 2/2001 | Kelly et al. | |
| 6,204,163 | B1 | * | 3/2001 | Panchou et al. | 438/613 |
| 6,252,301 | B1 | * | 6/2001 | Gilleo et al. | 257/690 |

(Continued)

FOREIGN PATENT DOCUMENTS

| EP | 1215948 A2 | 6/2002 |
| EP | 2237652 A1 | 10/2010 |

OTHER PUBLICATIONS

Narayan et al., "Thin Film Transfer Process for Low Cost MCM's," T. J. Watson Research Center, Yorktown Heights, NY, pp. 373-380, 1993.

(Continued)

*Primary Examiner* — Chris Chu
(74) *Attorney, Agent, or Firm* — Allen, Dyer, Doppelt, Milbrath & Gilchrist, P.A.

(57) ABSTRACT

A method of making an electronic device includes forming an electrically conductive pattern on a substrate, forming a coverlay layer on the substrate and the electrically conductive pattern, forming a partially cured, tacky adhesive layer on the coverlay layer, and forming openings in the coverlay layer and the partially cured, tacky adhesive layer aligned with the electrically conductive pattern. The method includes positioning an IC on the partially cured, tacky adhesive layer and thereafter curing the partially cured tacky adhesive layer to thereby simultaneously mechanically secure and electrically interconnect the IC to the substrate, the IC having bond pads on a surface thereof.

25 Claims, 4 Drawing Sheets

(56) References Cited

U.S. PATENT DOCUMENTS

| | | | |
|---|---|---|---|
| 6,372,992 | B1 | 4/2002 | Yang |
| 6,774,493 | B2* | 8/2004 | Capote et al. ............ 257/778 |
| 6,821,878 | B2* | 11/2004 | Danvir et al. ............ 438/613 |
| 6,911,606 | B2* | 6/2005 | Suda ............ 174/259 |
| 6,998,327 | B2 | 2/2006 | Danielson et al. |
| 7,226,821 | B2 | 6/2007 | Primavera et al. |
| 7,343,675 | B2 | 3/2008 | Smith et al. |
| 7,485,489 | B2 | 2/2009 | Bjorbell |
| 7,497,911 | B2 | 3/2009 | Primavera et al. |
| 7,820,233 | B2 | 10/2010 | Chen et al. |
| 8,011,589 | B2 | 9/2011 | Kato et al. |
| 8,013,688 | B2 | 9/2011 | White et al. |
| 8,072,768 | B2 | 12/2011 | Ockenfuss et al. |
| 8,161,633 | B2 | 4/2012 | Shacklette et al. |
| 8,173,490 | B2 | 5/2012 | Eckhardt et al. |
| 8,318,537 | B2* | 11/2012 | Pendse ............ 438/108 |
| 2001/0017414 | A1 | 8/2001 | Gilleo |
| 2005/0112798 | A1 | 5/2005 | Bjorbell |
| 2006/0068576 | A1 | 3/2006 | Burdick, Jr. et al. |
| 2007/0025092 | A1 | 2/2007 | Lee et al. |
| 2007/0048904 | A1* | 3/2007 | Frutschy ............ 438/108 |
| 2007/0243664 | A1* | 10/2007 | Hirano et al. ............ 438/108 |
| 2008/0075836 | A1 | 3/2008 | Chen et al. |
| 2008/0139013 | A1 | 6/2008 | Tomura et al. |
| 2008/0178463 | A1 | 7/2008 | Okubora |
| 2008/0179724 | A1 | 7/2008 | Gregory |
| 2008/0244898 | A1 | 10/2008 | Shacklette et al. |
| 2008/0277150 | A1 | 11/2008 | Takashima et al. |
| 2009/0084595 | A1 | 4/2009 | Park et al. |
| 2009/0250253 | A1 | 10/2009 | Park et al. |
| 2010/0066683 | A1 | 3/2010 | Chang et al. |
| 2012/0038593 | A1 | 2/2012 | Ronka et al. |
| 2012/0098129 | A1 | 4/2012 | Reed et al. |
| 2012/0168948 | A1 | 7/2012 | Rathburn |
| 2012/0182701 | A1 | 7/2012 | Weatherspoon et al. |
| 2012/0182702 | A1 | 7/2012 | Rendek, Jr. et al. |

OTHER PUBLICATIONS

Zhang et al., "Flexible Electronics: Thin Silicon Die on Flexible Substrates," IEEE Transactions on Electronics Packaging Manufacturing, vol. 32, No. 4, Oct. 2009, pp. 291-300.

Culbertson, "A New Laminate Material for High Performance PCBs: Liquid Crystal Polymer Copper Clad Films," Hoechst Celanese Corporation, downloaded from IEEE Xplore Aug. 12, 2010, pp. 520-523.

Zhang et al., "The Processing and Assembly of Liquid Crystalline Polymer Printed Circuits," 9 pages.

* cited by examiner

METHOD FOR MAKING ELECTRONIC DEVICE WITH LIQUID CRYSTAL POLYMER AND RELATED DEVICES

FIELD OF THE INVENTION

The present invention relates to the field of electronic devices, and, more particularly, to liquid crystal polymer packaging of electronic devices and related methods.

BACKGROUND OF THE INVENTION

As semiconductor and integrated circuit (IC) technology has advanced, there has been a trend toward high-functionality IC components with numerous input and output (IO) pins, together with a demand for reduced chip size, weight, and power consumption. Consequently, as (TO) density increases, the pin size and spacing between pins must decrease.

To match the pin spacing of these ICs, there is a demand for printed circuit boards which will therefore have small, closely arranged solder pads. However, the reduction of the spacing between IC pins is currently happening at a greater rate than the corresponding solder pads on printed circuit boards. Consequently, there may be an interconnection technology gap for some modern devices.

To make such devices function, printed circuit boards may have extra routing layers to handle the pins of the ICs, or utilize fan-out packaging. This results in the package size of the IC being larger than the IC itself, which may limit system miniaturization. In addition to the desire for miniaturized devices, it is also desirable in some cases to construct these devices from a flexible, and not rigid, substrate.

One material now being used as a substrate from which to construct thin and flexible printed circuit boards is liquid crystal polymer (LCP). The molecules in LCPs have rigid, rod-like shapes, and maintain a crystalline order when in a liquid phase or when heated and melted. T. Zhang, W. Johnson, B. Farrell, and M. St. Lawrence, in their paper "The processing and assembly of liquid crystalline polymer printed circuits," 2002 Int. Symposium on Microelectronics, 2002 discloses the construction of a printed circuit board using LCP as a substrate. A photoresist is first applied to a copper clad laminate, exposed, and developed to define a desired circuit pattern. The actual circuit is then defined by etching the exposed copper away. Holes or vias are created in the substrate via mechanical drilling. A desmearing step is then performed to remove debris from the vias or holes, thereby preparing the LCP material for metal deposition. A metallization step is next performed, and a typical solder mask is applied to the LCP substrate. Solder is then applied through the typical solder mask to complete the construction of the LCP printed circuit board.

While this design does allow for the creation of thin, flexible printed circuit boards, it still suffers from the same drawbacks as described above with respect to the attachment of ICs with closely spaced pins thereto. As such, additional methods of connecting ICs to printed circuit boards are needed.

The above described packaging issues may also be present when mounting a flip chip IC onto the printed circuit board. As with wire bond ICs, the board level interconnect for a flip chip device may comprise fan-out connectors due to limited feature resolution. Moreover, in these applications, under fill adhesive is formed under the flip chip IC to provide mechanical and environmental protection of the IC. Regardless of whether flip chip or wire bond ICs are used, as the packaging becomes more miniaturized, there is greater difficulty in controlling the placement and curing of the adhesive. For example, the adhesive may flow into sensitive areas, such as lithographically-defined solder mask openings and interconnect pads.

Moreover, with reduced pin sizes in state-of-the-art ICs comes a reduced standoff height between the flip chip ICs and the substrate. This may render capillary under fill techniques more difficult. One approach to manufacturing flip chip ICs is disclosed in U.S. Pat. No. 7,820,233 to Chen et al. Chen et al. discloses a method of manufacturing flip chip ICs. The method comprises forming a patterned resist layer on a surface of a carrier, forming sequentially a first metal layer, an etching stop layer, and a second metal layer, removing the resist layer, and forming a patterned first solder mask, and then forming at least one first circuit build up structure thereon. The method also includes forming a patterned second solder mask on the circuit build up structure, removing the carrier, the first metal layer, and the etching-stop layer, and forming solder bumps on both sides of the circuit build up structure. A drawback to such an approach may be increased costs due to the high number of steps in the manufacturing process.

SUMMARY OF THE INVENTION

In view of the foregoing background, it is therefore an object of the present invention to provide a method for making an electronic device having reduced size connector pads.

This and other objects, features, and advantages in accordance with the present invention are provided by a method of making an electronic device. The method comprises forming an electrically conductive pattern on a substrate, forming a coverlay layer on the substrate and the electrically conductive pattern, and forming a partially cured, tacky adhesive layer on the coverlay layer. The method also includes forming a plurality of openings in the coverlay layer (e.g. LCP) and the partially cured, tacky adhesive layer and being aligned with the electrically conductive pattern, and positioning an IC on the partially cured, tacky adhesive layer and thereafter curing the partially cured tacky adhesive layer to thereby simultaneously mechanically secure and electrically interconnect the IC to the substrate, the IC having a plurality of bond pads on a surface thereof. Advantageously, the electronic device may be formed with high resolution and reduced stand-off height bond pad connections.

More specifically, the method may further comprise laminating the coverlay layer to the substrate and the electrically conductive pattern. The method further may comprise partially curing the adhesive layer before the forming of the plurality of openings. In some embodiments, the forming of the plurality of openings in the coverlay and partially cured, tacky adhesive layers may comprise laser defining the plurality of openings.

Another aspect is directed to an electronic device comprising a substrate, and an electrically conductive pattern on the substrate and comprising a plurality of traces. The electronic device includes a coverlay layer on the substrate and the electrically conductive pattern, and a cured adhesive layer serving as a low profile mechanical underfill on the coverlay layer, the cured adhesive layer and the coverlay layer each having a plurality of openings therein aligned with the electrically conductive pattern, each opening having a respective width less than that of a respective trace in the electrically conductive pattern. The electronic device includes an IC on the cured adhesive layer and having a plurality of bond pads on a surface thereof.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
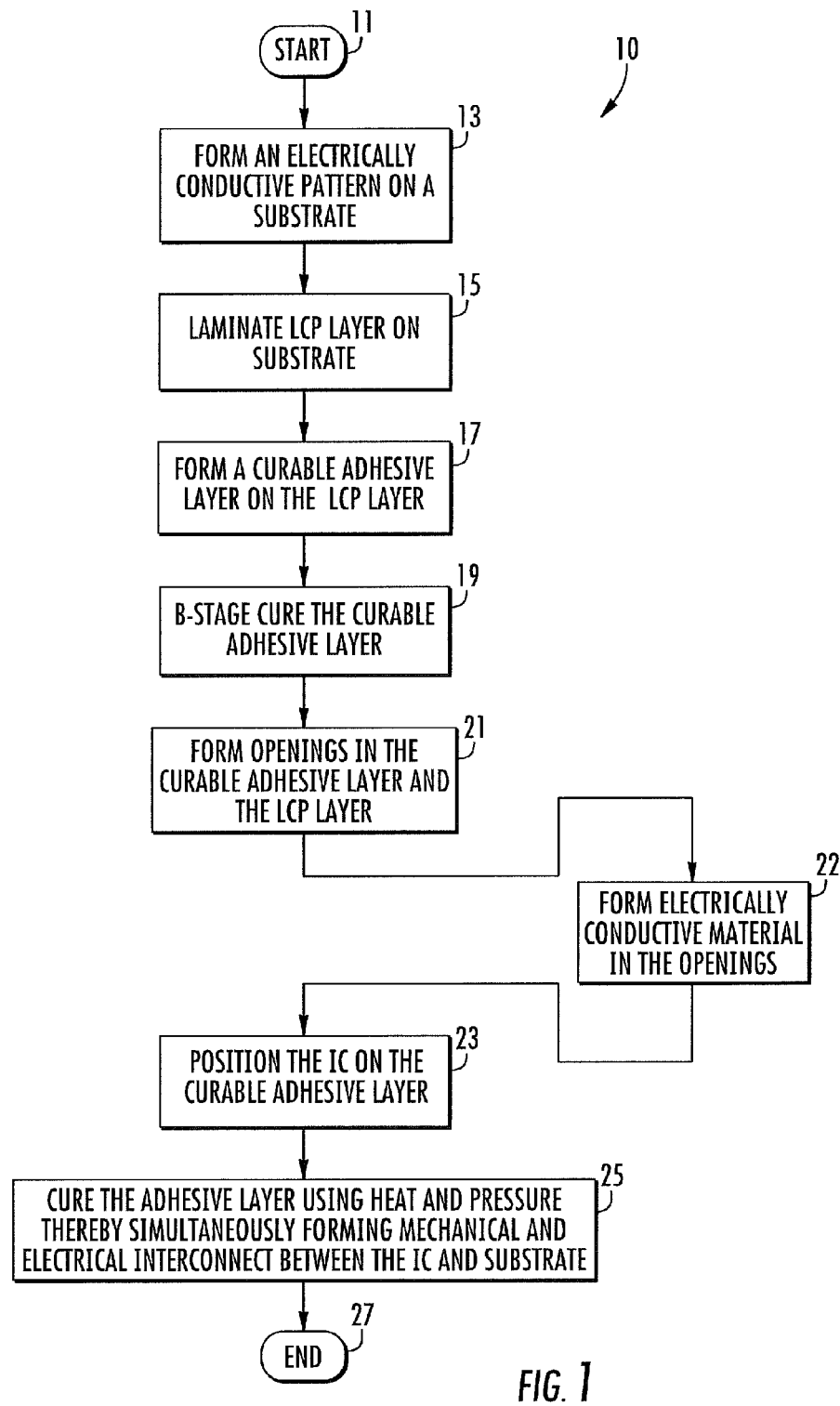
FIG. 1 is a flowchart of a method of making an electronic device, according to the present invention.
Figure 2A:
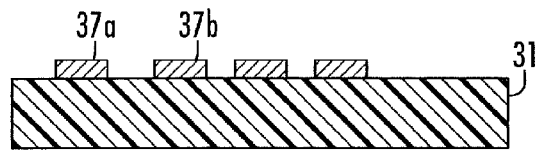
FIGS. 2A-2E are schematic diagrams of the steps in the method of FIG. 1.
Figure 2B:
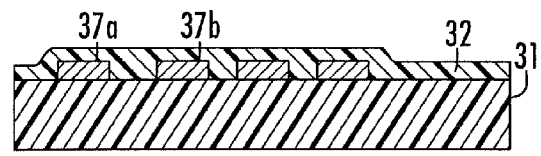
Figure 2C:
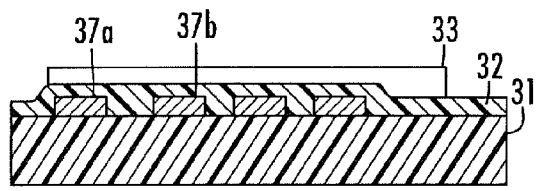
Figure 2D:
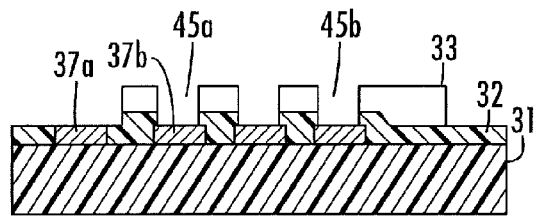
Figure 2E:
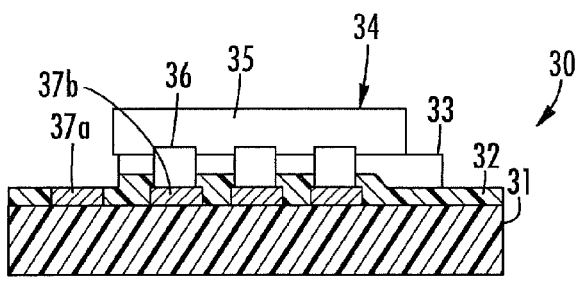

Referring now to FIGS. 1-2E and to a flowchart 10, a method of making an electronic device 30 according to the present invention is now described. (Block 11). The method comprises forming an electrically conductive pattern 37a-37b on a substrate 31 (Block 13). For example, the substrate 31 may comprise a rigid semiconductor substrate (e.g. silicon, Gallium arsenide, ceramic) or an organic rigid or flexible substrate (e.g. LCP, epoxy glass laminate, polyimide, Polytetrafluoroethylene (PTFE)).

The method includes forming an LCP layer 32 on the substrate 31 and the electrically conductive pattern 37a-37b. The method further comprises laminating the LCP layer 32 to the substrate and the electrically conductive pattern 37a-37b. The lamination process would include a heating and/or applying of pressure to the LCP layer 32 (Block 15).

The method includes forming a curable adhesive layer 33 on the LCP layer 32 (Block 17). The curable adhesive layer 33 may comprise a B-stage epoxy or polyimide-based adhesive, and the curable adhesive layer may be tacky prior to curing. In some embodiments, the adhesive may have a liquid form before the B-stage curing, thereby making uniform application thereof easier. The method further comprises partially curing the curable adhesive layer 33 (Block 19) to define a partially cured, tacky adhesive layer. The partially cured, tacky adhesive layer 33 is capable of flowing and adhering at an elevated temperature and/or pressure.

The method also includes forming a plurality of openings 45a-45b in the LCP layer 32 and the curable adhesive layer 33 (partially cured, i.e. B-staged) (Block 21). In one embodiment, the openings 45a-45b are formed using the laser milling disclosure of U.S. Patent Application Publication No. 2012/0182702, published Jul. 19, 2012, also assigned to the present applications assignee, the contents of which are hereby incorporated by reference in their entirety. Advantageously, the method leverages the enhanced resolution of the laser milling to create openings in the LCP and curable adhesive layers 32, 33. In particular, the openings 45a-45b may be formed as small as 0.001-0.002 inches (25-50 microns). For example, the laser milling step may use a picosecond pulsed laser drill. Moreover, the positional accuracy of the openings 45a-45b may be formed in the 0.0005-0.001 inches range (10-25 microns).

Moreover, the laser milling step also accurately removes the curable adhesive layer 33 from portions of the electronic device 30. Advantageously, this may address the issues with controlling the dispensing of adhesive in existing approaches.

As perhaps best seen in FIG. 2D, the openings 45a-45b are aligned with the conductive traces of the electrically conductive pattern 37a-37b. The method also illustratively includes filling electrically conductive material 36 in the openings 45a-45b before the positioning of an IC 34 (Block 22). The IC 34 may comprise any number of devices, such as an optical sensor, microcontroller, field-programmable gate array (FPGA), radio frequency monolithic microwave integrated circuit (RF MMIC), voltage regulator, analog to digital converters, etc. For example, the electrically conductive material may comprise solder, conductive epoxy, gold stud bumps, or solder capped copper pillars. The forming of the openings 45a-45b in the LCP and curable adhesive layers 32, 33 illustratively comprises forming the plurality of openings to each have a respective width less than that of a trace in the electrically conductive pattern 37a-37b. Advantageously, this approach reduces the likelihood of bridging adjacent interconnect pads. Limitations in the size of the openings created in the LCP and curable adhesive layers are defined not by the laser, but by the ability to insert conductive fill material into high aspect ratio openings.

The method includes positioning the IC 34 on the curable adhesive layer 33 while tacky and thereafter curing the curable adhesive layer to thereby simultaneously mechanically secure and electrically interconnect the IC to the substrate 31 (Blocks 23, 25). This final curing stage occurs at a higher temperature and/or pressure than the prior B-stage curing. The IC 34 illustratively includes a semiconductor substrate having a surface, and a plurality of bond pads on a surface thereof.

In the illustrated embodiment, the IC 34 comprises a flip chip IC. The positioning illustratively is so that the curable adhesive layer 33 is adjacent the plurality of bond pads (Block 27). Advantageously, the LCP layer 32 and the curable adhesive layer 33 fulfill the requirements of a coverlay and under fill material in devices, respectively. These layers 32, 33 provide a thin under fill that reduces the overall height of the electronic device 30 yet removes the need for dams and high accuracy capillary action encapsulation materials of existing approaches.

Another aspect is directed to an electronic device 30 comprising a substrate 31, and an electrically conductive pattern 37a-37b on the substrate and comprising a plurality of traces. The electronic device includes an LCP layer 32 on the substrate 31 and the electrically conductive pattern 37a-37b, and a cured adhesive layer 33 on the LCP layer, the cured adhesive layer and the LCP layer each having a plurality of openings 45a-45b therein aligned with the electrically conductive pattern, each opening having a respective width less than that of a respective trace in the electrically conductive pattern. The electronic device includes an IC 34 on the cured adhesive layer 33 and having a plurality of bond pads on a surface thereof.

Figure 3:
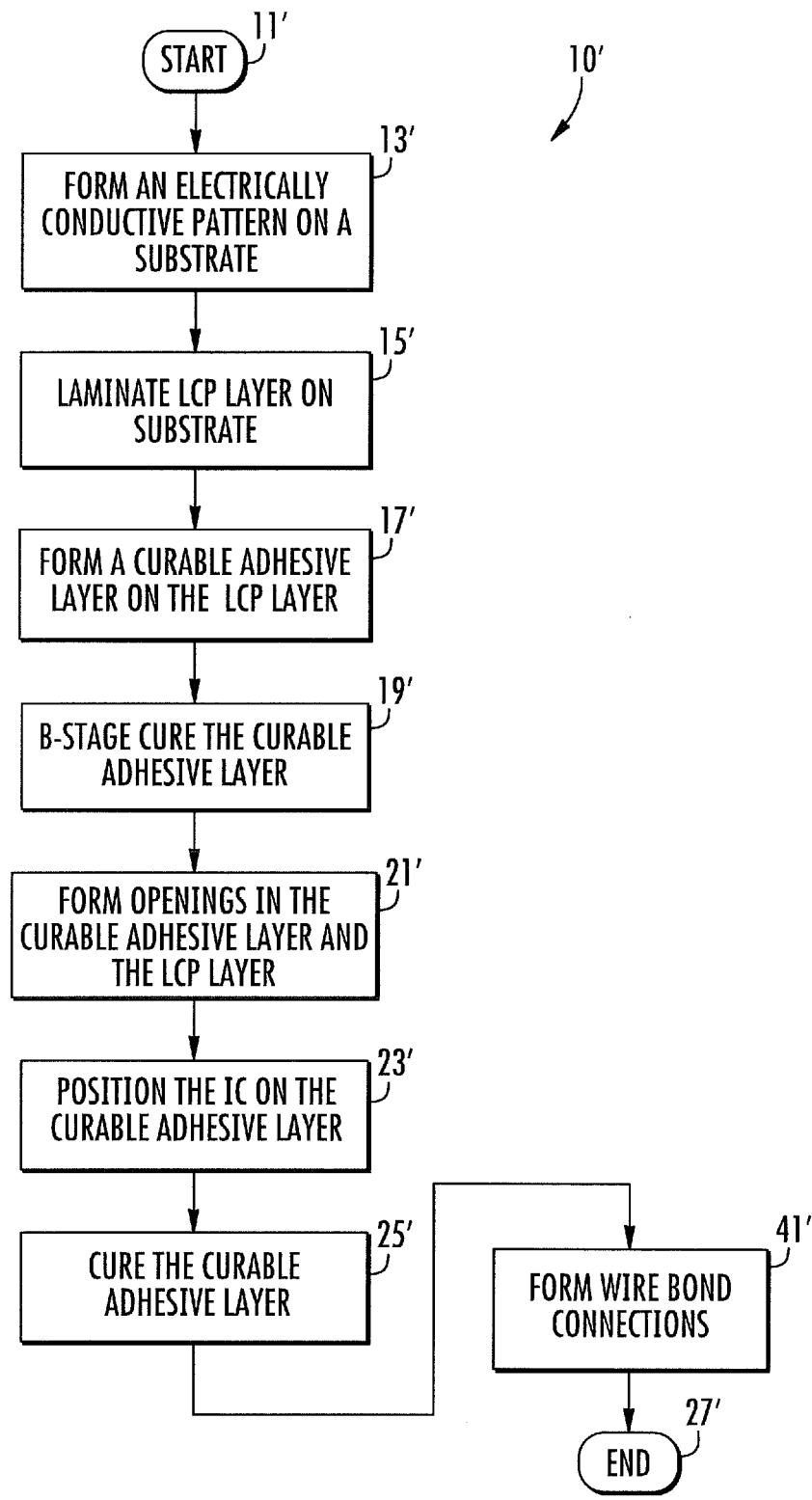
FIG. 3 is a flowchart of another embodiment of a method of making an electronic device, according to the present invention.
Figure 4A:
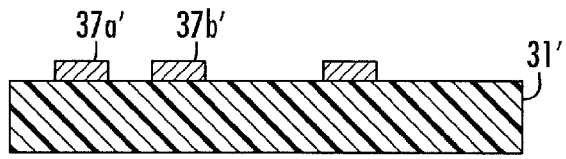
FIGS. 4A-4E are schematic diagrams of the steps in the method of FIG. 3.
Figure 4B:
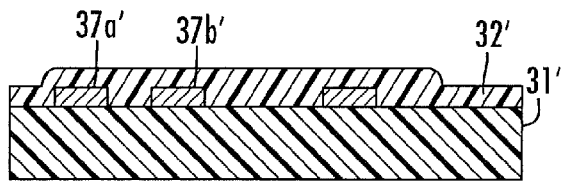
Figure 4C:
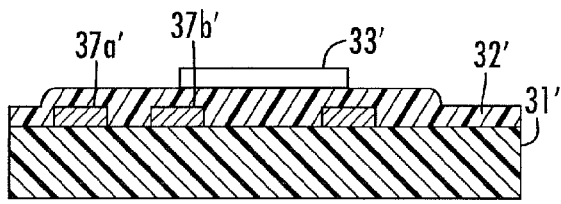
Figure 4D:
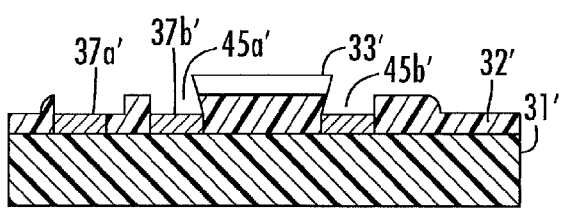
Figure 4E:
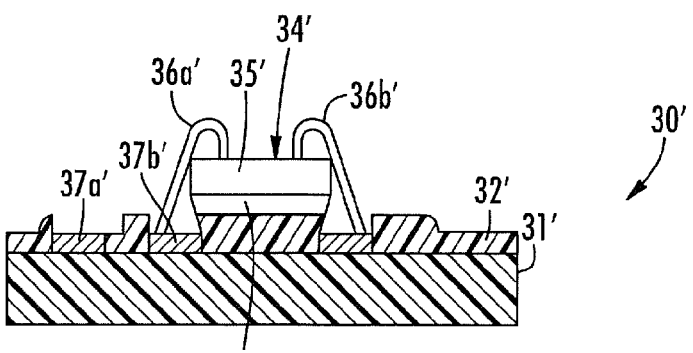

Referring now additionally to FIGS. 3-4E and flowchart 10', another embodiment of the method to make an electronic device 30' is now described. In this embodiment of the method of making the electronic device 30', those elements already discussed above with respect to FIGS. 1-2E are given prime notation and most require no further discussion herein. This embodiment differs from the previous embodiment in that this IC 34' has top side interconnect (wire bond applications). The positioning may be so that the curable adhesive layer 33' is adjacent a side opposite to the surface with the plurality of bond pads thereon. Also, the method further comprises forming a plurality of electrically conductive wire bonds 36a'-36b' for coupling the electrically conductive pattern 37a'-37b' to the plurality of bond pads. The electrically conductive wire bonds 36a'-36b' are formed after the final curing of the curable adhesive layer 33'.

Other features relating to electronic devices are disclosed in co-pending application titled "METHOD FOR MAKING ELECTRONIC DEVICE WITH COVER LAYER WITH OPENINGS AND RELATED DEVICES," U.S. patent application Ser. No. 13/934,465 filed Jul. 3, 2013, incorporated herein by reference in its entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:
   forming an electrically conductive pattern on a substrate;
   forming a coverlay layer on the substrate and the electrically conductive pattern;
   forming a partially cured, tacky adhesive layer on the LCP layer;
   forming a plurality of openings in the coverlay layer and the partially cured, tacky adhesive layer aligned with the electrically conductive pattern; and
   positioning an integrated circuit (IC) on the partially cured, tacky adhesive layer and thereafter curing the partially cured tacky adhesive layer thereby simultaneously mechanically securing and electrically interconnecting the IC to the substrate, the IC having a plurality of bond pads on a surface thereof.

2. The method of claim 1 wherein the forming of the coverlay layer comprises forming at least one of a liquid crystal polymer (LCP) layer, polyimide films, or liquid photoimageable materials.

3. The method of claim 1 further comprising laminating the coverlay layer to the substrate and the electrically conductive pattern.

4. The method of claim 1 wherein the forming of the plurality of openings in the coverlay and partially cured, tacky adhesive layers comprises laser milling the plurality of openings.

5. The method of claim 1 wherein the IC is a flip chip, and the positioning is so that the partially cured, tacky adhesive layer is adjacent the plurality of bond pads.

6. The method of claim 1 wherein the positioning comprises positioning the partially cured, tacky adhesive layer adjacent a side opposite to the surface with the plurality of bond pads thereon; and further comprising forming a plurality of electrically conductive wire bonds for coupling the electrically conductive pattern to the plurality of bond pads.

7. The method of claim 1 wherein the forming of the plurality of openings in the coverlay and partially cured, tacky adhesive layers comprises forming the plurality of openings to each have a respective width less than that of a trace in the electrically conductive pattern.

8. The method of claim 1 further comprising filling electrically conductive material in the plurality of openings before the positioning of the IC.

9. The method of claim 1 further comprising providing the substrate to comprise a rigid semiconductor substrate.

10. The method of claim 1 further comprising providing the substrate to comprise an organic flexible substrate.

11. The method of claim 1 further comprising providing the substrate to comprise a rigid substrate.

12. A method of making an electronic device comprising:
    forming an electrically conductive pattern on a substrate;
    forming a liquid crystal polymer (LCP) layer on the substrate and the electrically conductive pattern;
    laminating the LCP layer to the substrate and the electrically conductive pattern;
    forming a curable adhesive layer on the LCP layer;
    partially curing the curable adhesive layer to define a partially cured, tacky adhesive layer;
    after the partial curing, forming a plurality of openings in the LCP layer and the partially cured, tacky adhesive layer aligned with the electrically conductive pattern; and
    positioning an integrated circuit (IC) on the partially cured, tacky adhesive layer and thereafter curing the partially cured, tacky adhesive layer to thereby simultaneously mechanically secure and electrically interconnect the IC to the substrate, the IC having a plurality of bond pads on a surface thereof.

13. The method of claim 12 wherein the forming of the plurality of openings in the LCP and partially cured, tacky adhesive layers comprises laser milling the plurality of openings.

14. The method of claim 12 wherein the IC is a flip chip, and the positioning is so that the partially cured, tacky adhesive layer is adjacent the plurality of bond pads.

15. The method of claim 12 wherein the positioning is so that the partially cured, tacky adhesive layer is adjacent a side opposite to the surface with the plurality of bond pads thereon; and further comprising forming a plurality of electrically conductive wire bonds for coupling the electrically conductive pattern to the plurality of bond pads.

16. The method of claim 12 wherein the forming of the plurality of openings in the LCP and partially cured, tacky adhesive layers comprises forming the plurality of openings to each have a respective width less than that of a trace in the electrically conductive pattern.

17. The method of claim 12 further comprising filling electrically conductive material in the plurality of openings before the positioning of the IC.

18. An electronic device comprising:
    a substrate;
    an electrically conductive pattern on said substrate and comprising a plurality of traces;
    a coverlay layer on said substrate and said electrically conductive pattern;
    a cured adhesive layer on said coverlay layer, said cured adhesive layer and said coverlay layer each having a plurality of openings therein aligned with said electrically conductive pattern, each opening having a respective width less than that of a respective trace in the electrically conductive pattern; and
    an integrated circuit (IC) on said cured adhesive layer having a plurality of bond pads on a surface thereof.

19. The electronic device of claim 18 wherein said coverlay layer comprises at least one of a liquid crystal polymer (LCP) layer, polyimide films, or liquid photoimageable materials.

20. The electronic device of claim 18 wherein said IC is a flip chip; and wherein said curable adhesive layer is adjacent said plurality of bond pads.

21. The electronic device of claim 18 wherein said curable adhesive layer is adjacent a side opposite to the surface with said plurality of bond pads thereon; and further comprising a plurality of electrically conductive wire bonds for coupling said electrically conductive pattern to said plurality of bond pads.

22. The electronic device of claim 18 further comprising electrically conductive material in said plurality of openings.

23. The electronic device of claim 18 wherein said substrate comprises a rigid semiconductor substrate.

24. The electronic device of claim 18 wherein said substrate comprises an organic flexible substrate.

25. The electronic device of claim 18 wherein said substrate comprises a rigid substrate.

* * * * *